United States Patent [19]
Shennib et al.

[11] Patent Number: 5,898,572
[45] Date of Patent: Apr. 27, 1999

[54] METHOD AND APPARATUS FOR THE MITIGATION OF NOISE GENERATED BY PERSONAL COMPUTERS

[75] Inventors: Adnan Shennib, Fremont; Richard C. Urso, Redwood City; Michael J. Bennett, San Francisco, all of Calif.

[73] Assignee: Decibel Instruments, Inc., Fremont, Calif.

[21] Appl. No.: 08/773,754

[22] Filed: Dec. 24, 1996

[51] Int. Cl.⁶ ............................................. H05K 7/20
[52] U.S. Cl. .................... 361/713; 29/402.08; 181/202; 360/97.02; 361/704
[58] Field of Search .................... 165/80.3, 185; 174/52.2, 16.3; 361/685, 687, 690, 695, 704–710, 713, 717–720, 736, 752; 181/151, 200, 202, 282, 283; 360/97.01, 97.02; 264/112, 300, 272.11, 277, 278; 29/402.02, 402.06, 402.08, 840, 841, 865

[56] References Cited

U.S. PATENT DOCUMENTS

| | | | |
|---|---|---|---|
| 5,060,114 | 10/1991 | Feinberg | 361/387 |
| 5,324,888 | 6/1994 | Tyler | 174/52.2 |
| 5,378,924 | 1/1995 | Liang | 257/675 |
| 5,379,186 | 1/1995 | Gold | 361/706 |
| 5,381,304 | 1/1995 | Theroux | 361/706 |
| 5,438,162 | 8/1995 | Thompson | 174/52.2 |
| 5,510,954 | 4/1996 | Wyler | 361/685 |
| 5,633,533 | 5/1997 | Andros | 361/719 |
| 5,699,232 | 12/1997 | Neidig | 361/752 |

*Primary Examiner*—Gerald Tolin
*Attorney, Agent, or Firm*—Michael A. Glenn

[57] ABSTRACT

A method and apparatus for removing heat from an acoustically shielded electro-mechanical assembly without relying upon a convective air flow and without the provision of bulky external heat sinks provides an acoustically shielded electro-mechanical assembly, such as a hard disk drive, that may be used in a personal computer. The invention may be used successfully in any application where noise mitigation measures, such as encapsulation of an electro-mechanical assembly within an acoustic shield, otherwise cause undesirable overheating of the assembly.

21 Claims, 10 Drawing Sheets

METHOD AND APPARATUS FOR THE MITIGATION OF NOISE GENERATED BY PERSONAL COMPUTERS

BACKGROUND OF THE INVENTION

1. Technical Field

The invention relates to devices that generate undesirable acoustic noise, such as electrical or electro-mechanical assemblies. More particularly, the invention relates to the mitigation of noise generated by such assemblies in personal computers.

2. Description of the Prior Art

FIG. 1 is an exploded view of a typical personal computer having a tower configuration. The personal computer comprises a power supply 1 shown fitted to a case 2, a front cover 3, a floppy and hard drive controller 4, a video card 5, a floppy drive 6, a hard drive 7, a main or motherboard 8, an Input/Output (I/O) card 9, and a 5.25-inch floppy drive 10. Other boards or components may be added as required such as sound cards, CD ROM drives, or network adapters (not shown).

FIG. 2 shows the noise emissions at 1 meter for a typical desk top personal computer compared to the maximum permissible sound pressure levels in octave bands for audiometric conditions (audibility), when the listener's ears are not covered. The histogram shows that at all frequencies from 250 Hz to 4 kHz, the personal computer exceeds the permitted level by as much as 15 dB. This constant noise contributes to fatigue and irritation and, in fields such as sound recording or hearing evaluation, also precludes the presence of a computer in the recording room or hearing evaluation facility.

FIG. 3 is an exploded view of a typical hard drive for a personal computer. A metal frame 12 supports a motor 13 which drives the data storage disk 14. A servo mechanism 15 moves a read/write head 16 across the data storage disk 14. The head 16 is extremely close to, but not in contact with, the surface of the data storage disk 14. Variations in current flowing in coils located in the head 16 enable data to be written to the data storage disk 14 in the form of zeros or ones. Circuit boards 17a and 17b (see FIG. 4) containing various electrical components that comprise the driver hardware for the servo mechanism are coupled by a plug 18 to the hard drive controller 4 (see FIG. 1). A metal cover 19 prevents damage to the drive.

The motor 13 and the servo mechanism 15 in the disk drive are both sources of noise. In most computers, the hard drive motor 13 runs continuously. However, in laptop computers and notebook computers, sophisticated power management circuitry may turn the hard drive off when it is not needed. The noise from the servo mechanism is intermittent, occurring when data are being read or written.

Located within the computer tower is a power supply 1 (see FIG. 1). A typical desktop computer requires 100 to 250 Watts of power, some of which is converted to heat during operation of the computer. Natural convection and radiant heat loss from the computer case 2 is typically insufficient to conduct and dissipate the generated heat from the internal components of the personal computer. To prevent heat build-up within the personal computer, one or more cooling fans, vented to the external atmosphere are used to provide a flow of cooling air. Such cooling fans are also a source of noise within the personal computer.

Floppy disk and CD ROM drives are other sources of acoustic noise. They differ from the cooling fans and the hard drive only in that they are not usually continuous sources of noise. Floppy disks are typically used to transfer data from one computer to another and, because of that, are used infrequently and do not produce continual background noise, which is annoying to the user or which may interfere with various activities, such as recording or hearing evaluation. Similarly CD-ROM drives are used intermittently.

It is known to reduce noise generated by electro-mechanical devices, such as by various assemblies within personal computers, by surrounding the source of such noise within the device with a sound barrier material. However, such treatment reduces or eliminates convection cooling within the device, especially with regard to any assemblies that have been surrounded by such sound absorbing material. This lack of convective cooling in connection with such assemblies can lead to their overheating and failure.

The use of acoustic shielding to reduce noise levels is well known to those skilled in the arts. See, for example G. Wyler, Silent Disk Drive Assembly, U.S. Pat. No. 5,510,954 (Apr. 23, 1996), which discloses an acoustically shielded hard disk drive that uses a sound barrier layer to surround the disk drive assembly, and that provides a heat conductive path through the sound barrier layer to an externally mounted heat sink assembly.

It is commonly known to use heat sinks to improve the convective cooling of electronic components. It is also known to remove heat from the outer surfaces of a packaged device, such as a hard disk drive by the use of such techniques as surrounding the drive with a liquid heat sink in a pouch or by conducting heat to an external heat sink (see, for example Wyler, supra).

Unfortunately, the prior art does not address the problem of local overheating of components within a particular electro-mechanical assembly, such as a disk drive circuit board, that results when the convective air flow around the assembly is effectively eliminated by the placement of acoustic shielding around the assembly. Nor does the prior art provide a technique for accomplishing such acoustic shielding without the use of a bulky external heat sink that adds to the cost and complexity of the device (see, for example Wyler, supra).

SUMMARY OF THE INVENTION

The invention herein disclosed provides a method and apparatus for mitigating or eliminating undesirable acoustic noise generated by electrical or electro-mechanical assemblies. In the preferred embodiment of the invention (i.e. as applied to a personal computer), the invention provides a technique for reducing sound emissions from a hard disk drive without, at the same time, causing the internal components of the hard disk drive to overheat and fail. The invention also provides a technique for reducing objectionable noise produced by other components in a personal computer.

The invention provides such noise mitigation techniques that affect:

The hard drive;

The power supply;

The cooling fans; and

Component cooling.

To reduce sound emission from an electro-mechanical assembly, such as the hard disk drive, it is well known in the art to encapsulate the assembly in a sound absorbing material. Unfortunately, this encapsulation has the adverse effect of preventing the heat generated by such internal elements of the assembly as the motor, the servo mechanism, and the control circuitry, from escaping. This trapped heat can cause failure of the assembly, for example in a hard disk drive, by heating components within the assembly beyond their specified limits and/or for extended periods of time.

To reduce noise generation that results from use of cooling fans, fan speed should be reduced. Unfortunately, this lowers the cubic air flow capacity of the cooling fan and, consequently, the fan's cooling effect. This reduced air flow capacity, in turn, can cause thermal runaway in various components of the personal computer, such as the CPU and the power supply. The invention herein disclosed provides techniques that achieve the desirable sound emission reduction by efficiently conducting heat away from vulnerable components, such as the hard disk drive, and by using the frame and/or case of the computer as a heat sink. In those applications where it is still necessary to use a cooling fan, the fan is mounted to circulate air internally, rather than being mounted directly to the outside of the computer's case to exhaust air outside of the computer, such that direct transmission of the fan noise to the outside can occur.

DETAILED DESCRIPTION OF THE INVENTION

The personal computer described herein is the preferred embodiment of the invention and is designed to be used where the intrusive noise of conventional personal computers is unacceptable. The functionality of the personal computer is in no way modified from its specification. Careful changes have been made to permit sound generated by various sources to be attenuated or reduced without causing overheating of the electronic components or devices that comprise such sources. Because a hard disk drive is in constant use within the personal computer, the discussion herein is more concerned with the hard disk drive than with the floppy disk drive or CD ROM drive, which are each only used infrequently. For these reasons, floppy disk drives and CD-ROM drives are not primary targets for this invention, although application of the invention herein disclosed for this purpose is considered to be within the scope of the invention.

Encapsulation of a noise generating electro-mechanical assembly prevents not only sound from leaving the assembly, but also heat. Operating problems from heat can occur in the hard drive motor, servo mechanism, data recording medium, and in the control circuitry if no way of removing the excess heat is provided. One preferred embodiment of the invention provides a method and apparatus that is used to conduct heat away from the control circuitry.

Figure 4:
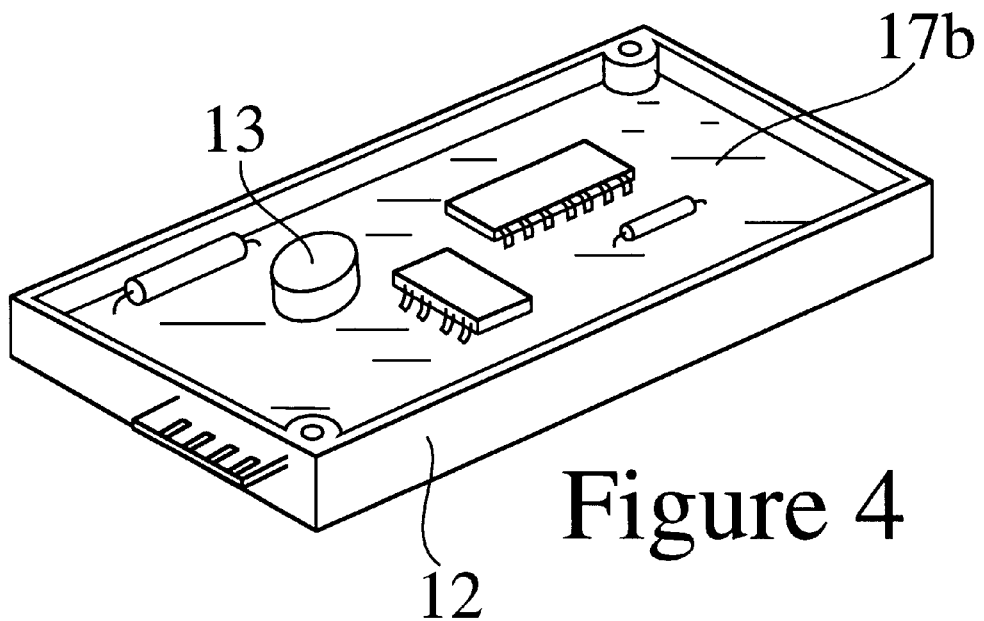
FIG. 4 is a perspective view of the internal elements of a typical hard disk drive showing control circuitry board.
Figure 5A:
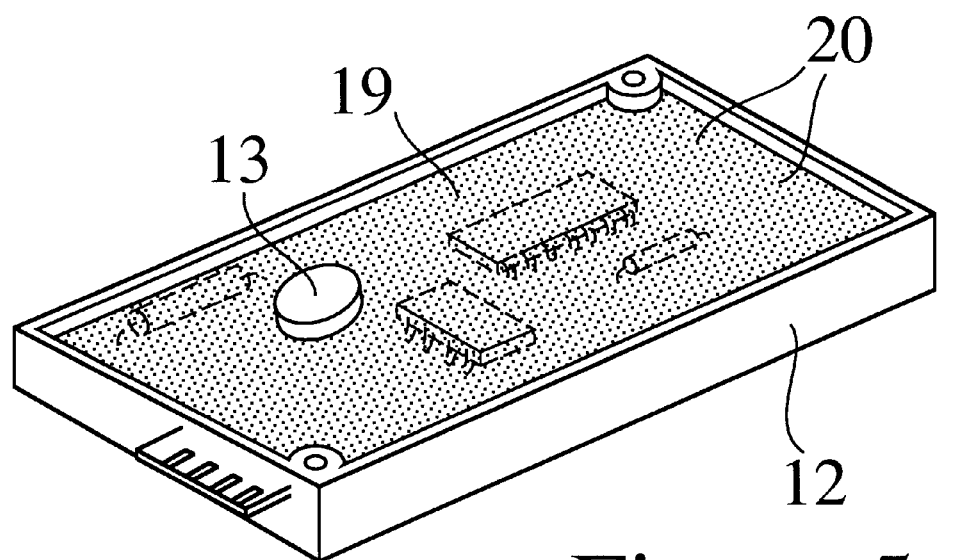
FIG. 5a shows the disk drive control circuitry board of FIG. 4 coated with a thermally-conductive silicone in accordance with the invention.

FIG. 4 shows the component side of the control circuitry board 17b as is known in the prior art. FIG. 5a shows the control circuitry board after it has been coated with a low viscosity, high density, thermally conductive, two part silicone 19, such as S-1378FR A/B (manufactured by Castall, Inc. of East Weymouth, Mass.) in accordance with the invention. The preferred material is flame retardant and has a volume resistivity of 1014 ohm-cm, and thus electrically an insulator to prevent electrical short circuits. Although the preferred embodiment discloses a coating, the invention contemplates the use of any heat conducting material that may be placed in intimate contact with the assembly components to provide a path along which heat may be conducted away from such components, for example heat conductive pads, greases, and foams.

Figure 5B:
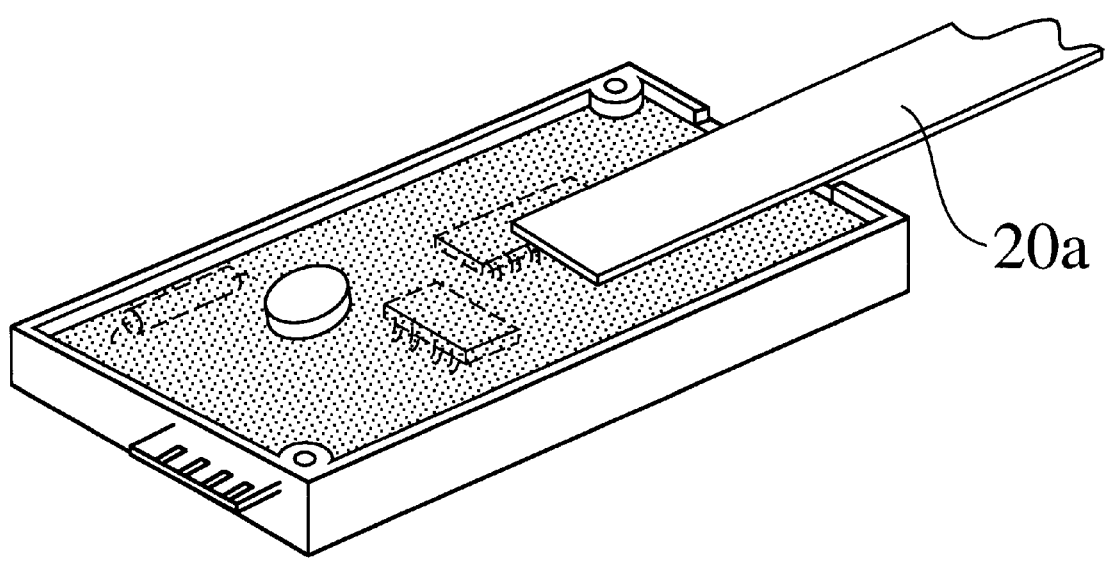
FIG. 5b shows a thermally-conductive strip for conducting heat away from the thermally-conductive silicone in accordance with the invention.

In the preferred embodiment, one or more contacts 20 are made between the silicone coating and the metal frame 12 of the hard disk drive. These contacts permit the heat from the components within the drive to be conducted, via the coating, to the frame of the hard disk drive. Alternatively, other methods of conducting the heat from the thermally conductive coating are employed, such as a metal conductive mounting plate 20a, as shown on FIG. 5b, which conducts heat away from the drive unit to the computer case.

In the preferred embodiment, the heat generated by the internal components of the hard disk drive is transferred to the frame of the hard disk drive. It may be necessary to conduct such heat away from the frame of the hard disk drive and, therefore, through the sound proofing encapsulation. The invention provides a number of techniques by which this may be accomplished without the need for an additional heat sink.

One embodiment of the invention uses a thermally conductive (electrically insulating) material for the sound proofing encapsulation. For example, the Castall S-1378FR material used for conduction on the control circuitry board (as discussed above) is itself used for encapsulation, as could many other heat conductive materials known to those skilled in the art. In another embodiment of the invention, the encapsulated drive is dimensioned such that it is wedged tightly into a disk drive bay 28, such that intimate contact is made between the encapsulation material and the metal of the computer frame, thereby permitting efficient thermal transfer to take place therebetween. Alternatively, a fastener, such as female screw threads or "PEMS," (not shown) is molded into the encapsulation. Such fasteners allow the encapsulated drive to be secured in place, while providing a thermal pathway, again ensuring efficient thermal transfer from the disk drive to the computer frame and/or case.

Figure 6:
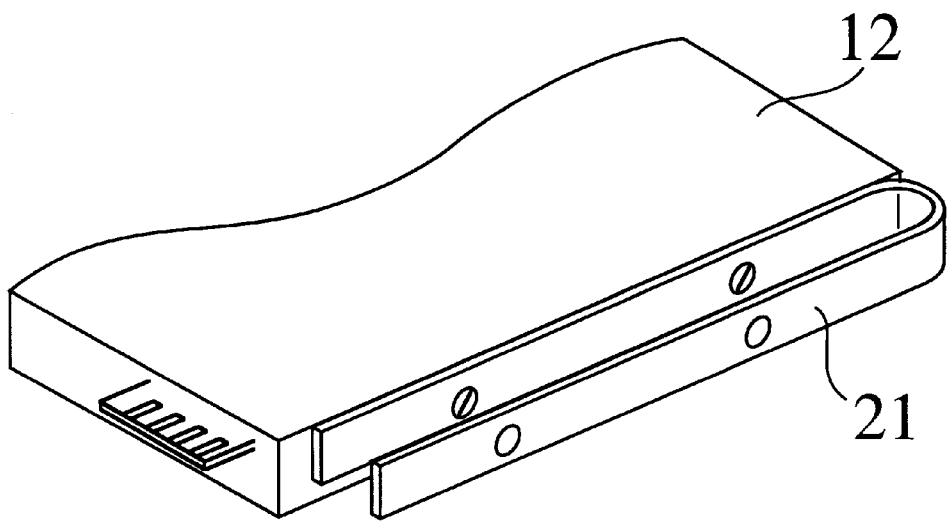
FIG. 6 is a perspective view of U-shaped, thermally conducting brackets in accordance with the invention.
Figure 7:
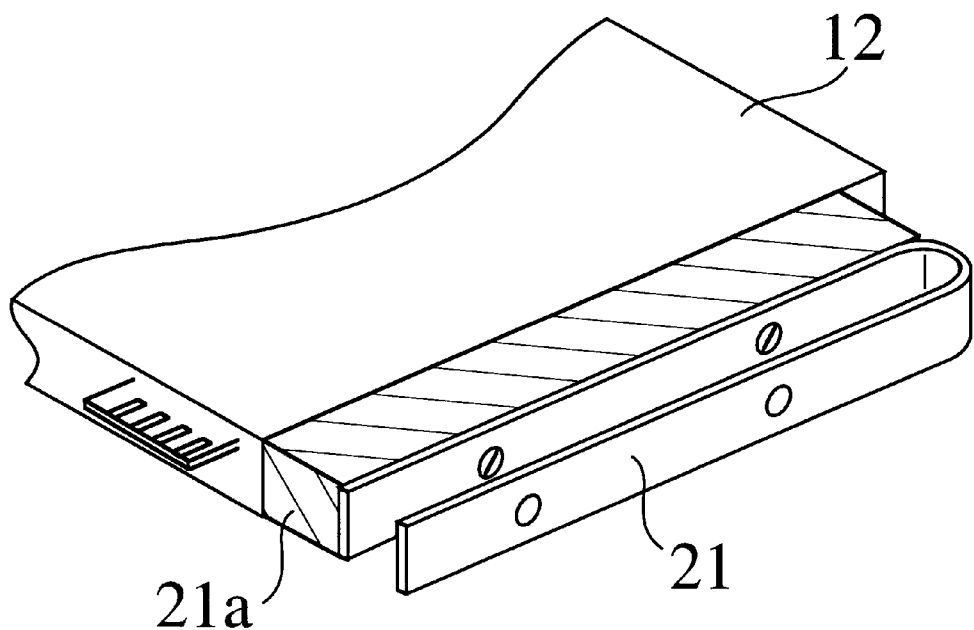
FIG. 7 shows a vibration absorbing pad for the U-shaped brackets of FIG. 6 in accordance with the invention.

A second, equally preferred embodiment of the invention uses thermally conductive brackets that attach the encapsulated hard disk drive to the normal mountings provided within the framework of the computer case, e.g. in a hard drive bay. In one embodiment, shown on FIG. 6, U-shaped brackets 21 (one bracket shown) screw to the metal frame 12 of the hard disk drive. The exemplary brackets are made of any thermally conductive material, such as aluminum, or thermally conductive plastics. In another embodiment, shown on FIG. 7, the brackets are separated from the hard disk frame by a heat-conducting, vibration absorbing spacer 21a.

A third, equally preferred embodiment of the invention uses heat conducting spacers (not shown) that are screwed to the hard disk drive frame, such that they protrude through the sound absorptive encapsulation material. These spacers are then screwed to the frame of the computer and permit heat transfer to take place.

Figure 1:
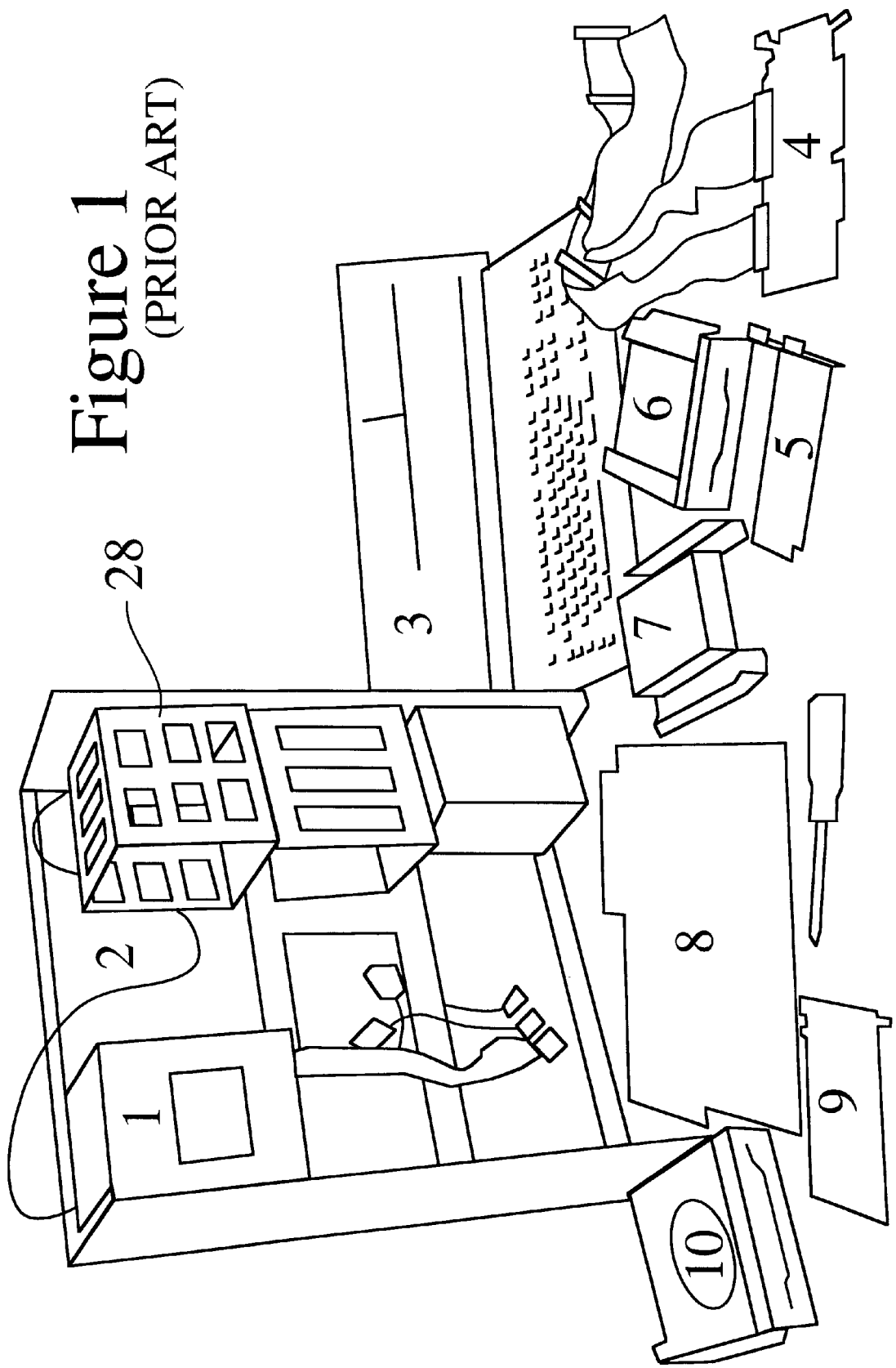
FIG. 1 is an exploded view of a typical desk top tower computer.
Figure 2:
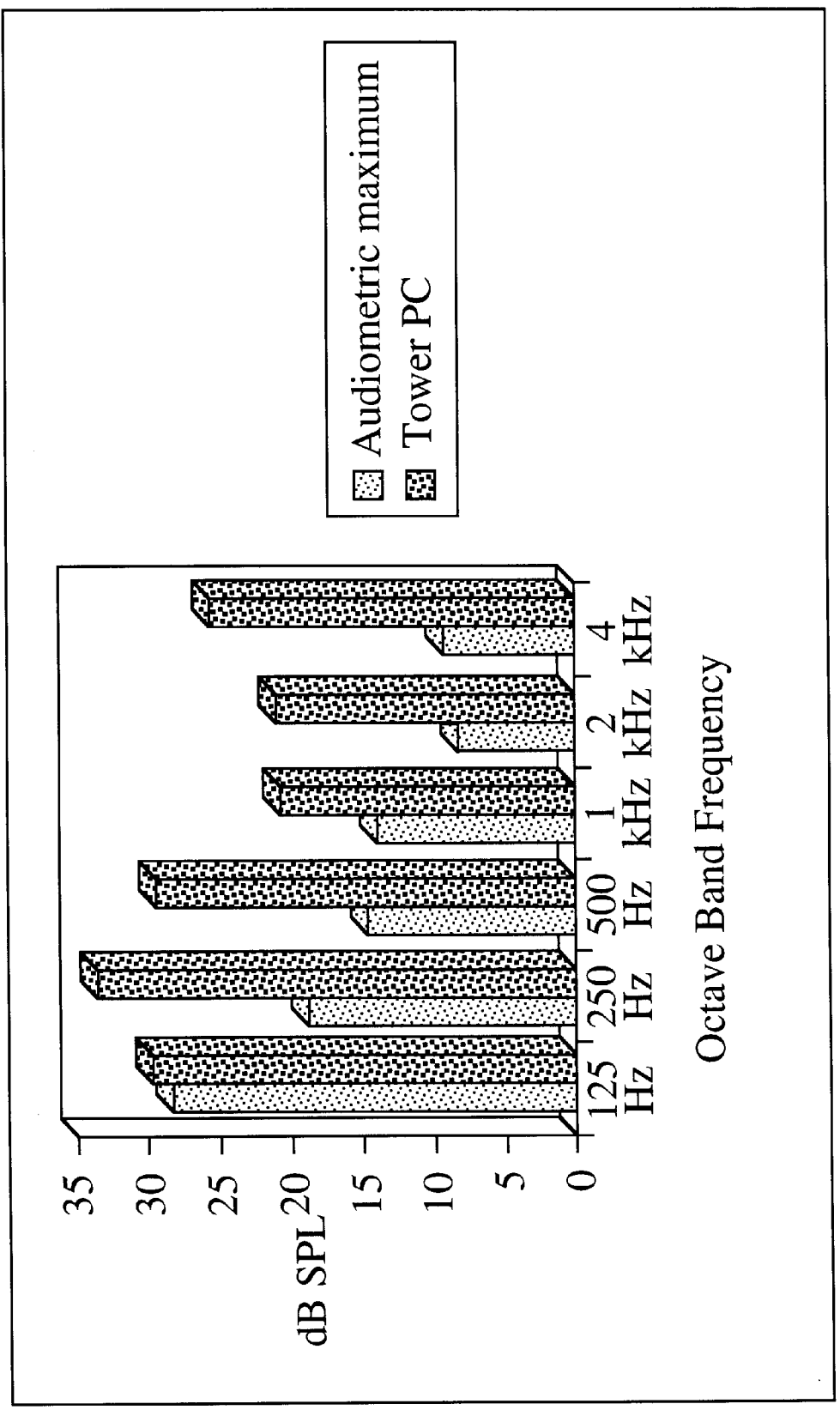
FIG. 2 shows the noise emissions at 1 meter for a typical desk top computer compared with the maximum permissible ambient noise sound pressure levels for audiometric conditions.
Figure 3:
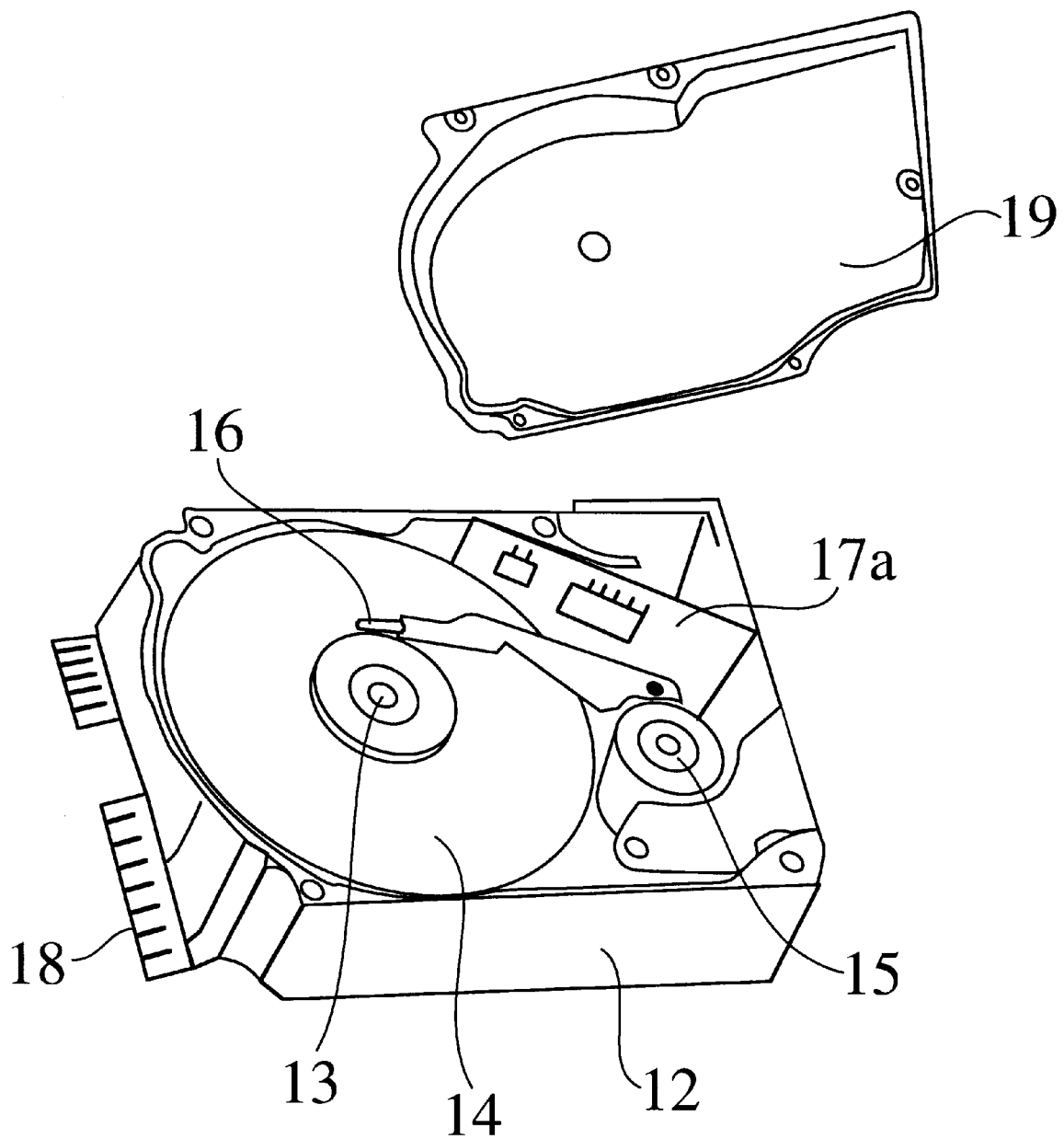
FIG. 3 is an exploded view of a hard disk drive.
Figure 8:
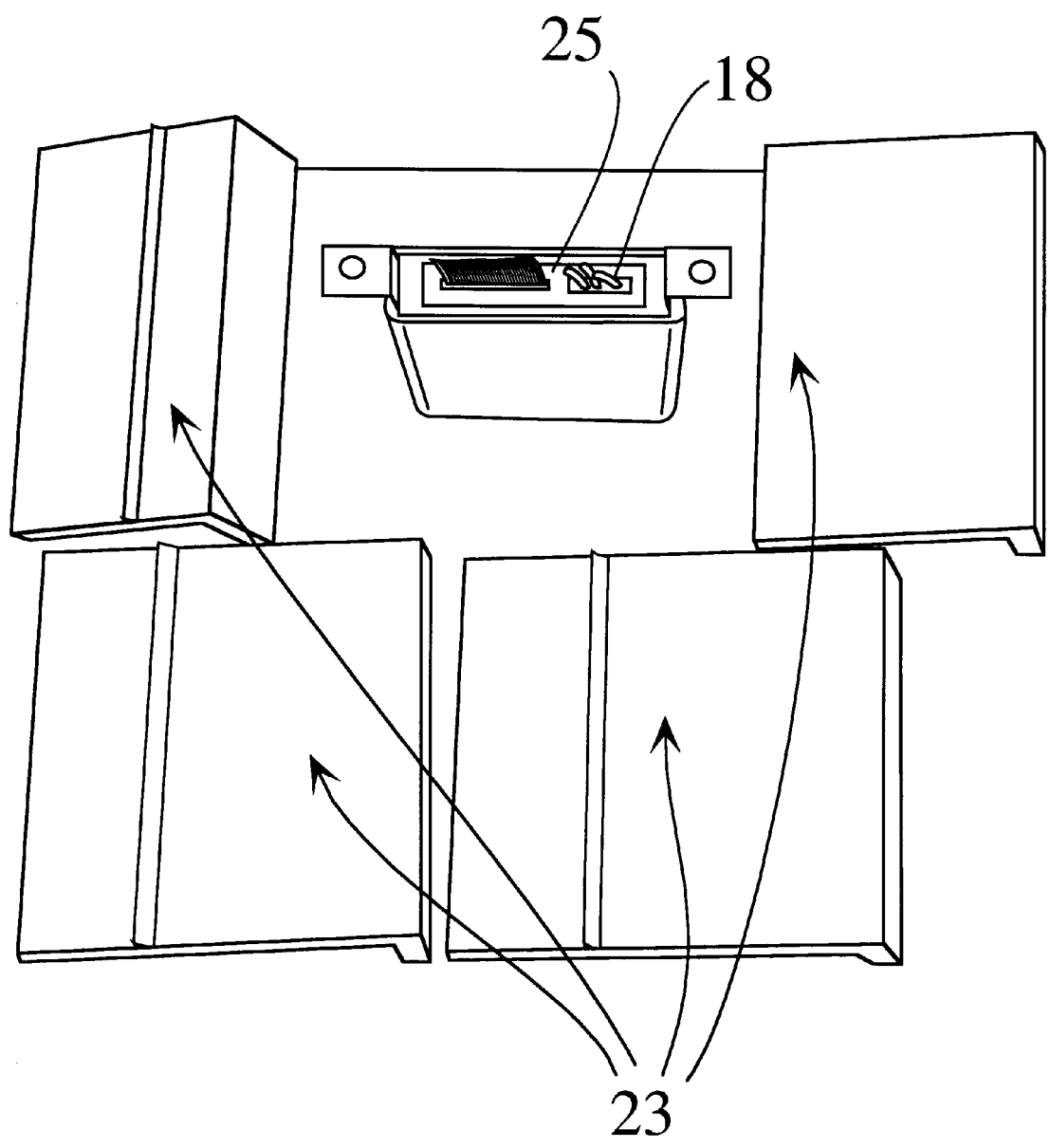
FIG. 8 is an exploded view of a hard disk drive encapsulation mold in accordance with the invention.
Figure 9:
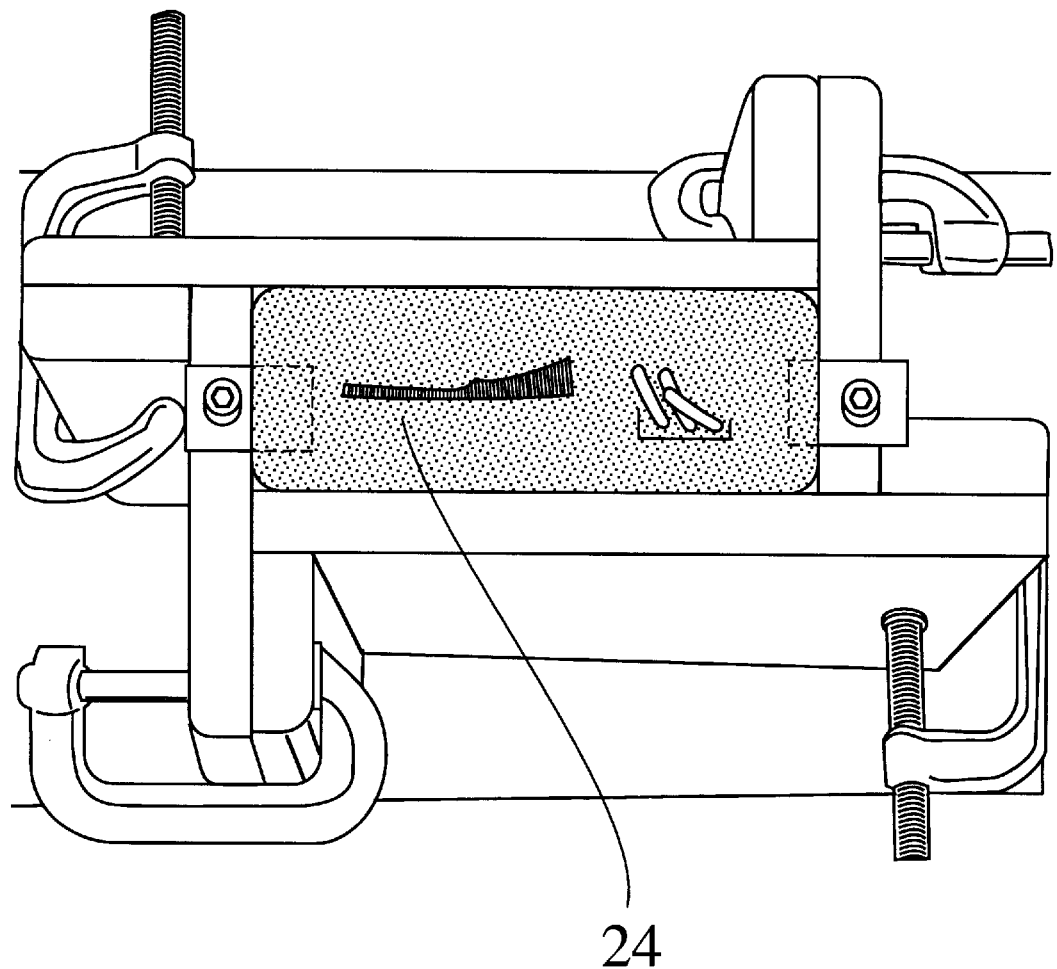
FIG. 9 shows a disk drive encapsulation cover being molded in accordance with the invention.
Figure 10:
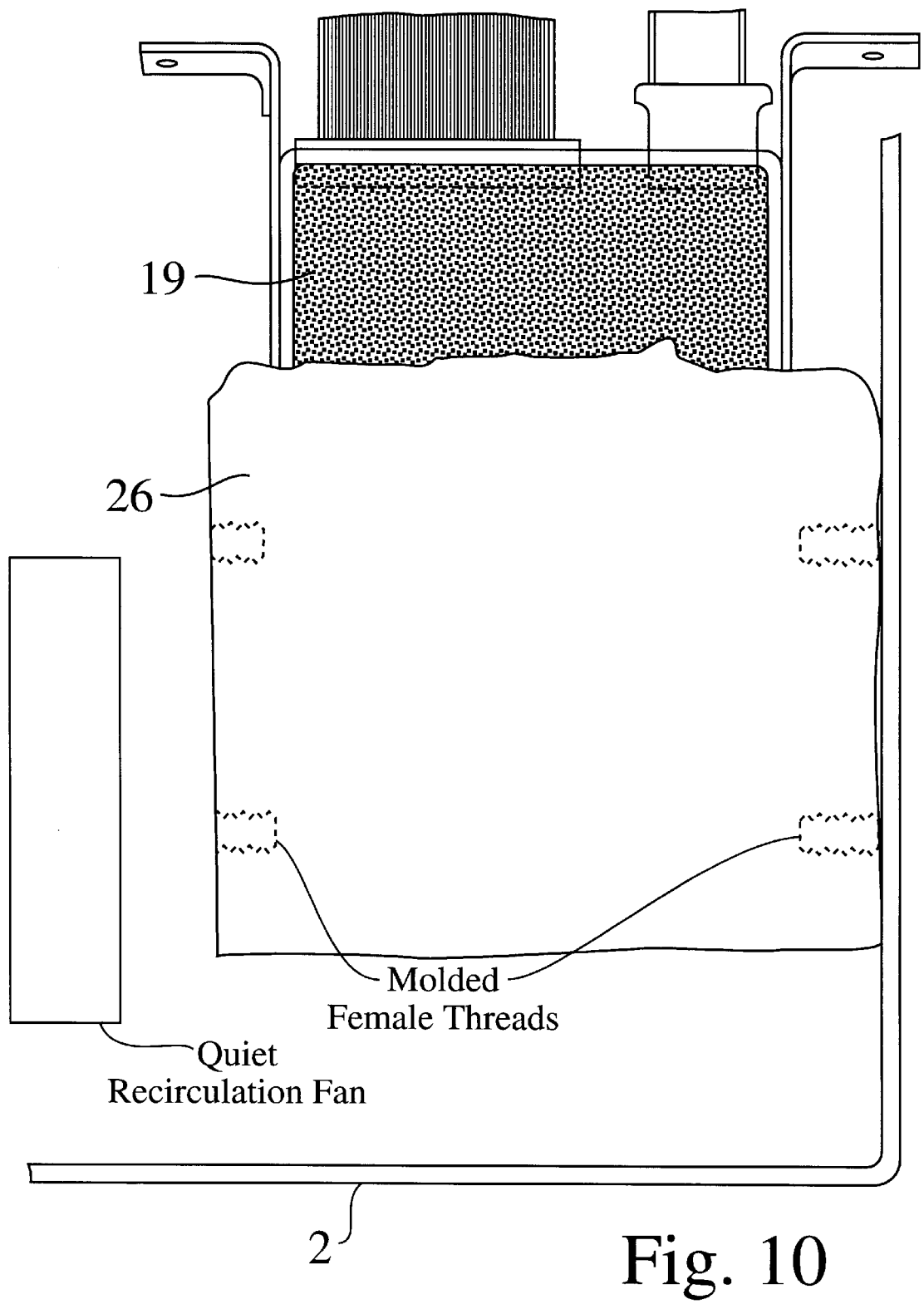
FIG. 10 shows removal of the mold core in accordance with the invention.

Whichever method of heat transfer from the disk drive frame is used, it is necessary to fully encapsulate the complete hard drive unit. This is because superior sound barrier is thought to take place only when a substantially air tight seal is provided by the encapsulating material. A suitable encapsulation cover is manufactured in a mold 23, shown exploded on FIG. 8, using a silicon molding compound 24 such as Castall S-1458, as shown on FIG. 9. After the encapsulation material is cured, the mold core 25, representing the hard disk drive and any bracket used, is removed. After assembly of any brackets (see FIGS. 6 and 7), the assembly is fitted into the encapsulation cover 26 as shown on FIG. 10. Any leaks around the drive plugs 18 (see FIG. 3) are sealed with a suitable material, such as silicone elastomer. The encapsulated hard drive unit is then fitted to the computer frame or drive bay 28 (see FIG. 1), thus ensuring good conduction of heat from the drive components to the tower case.

In the preferred embodiment of the invention, it is helpful to replace the standard power supply and CPU fans with an inherently quiet ventilation fan to reduce the fan noise. A suitable fan is manufactured by Mechatronics of Mercer Island, Wash., and offered as Model #F8025S. Such fan is a DC, brushless, ball bearing device having a rated noise level of 20 dBA.

To prevent noise generated by the fan from reaching the environment, it is also helpful to position the fan centrally within the computer, such that the fan recirculates air around the components rather than primarily exhausting the air to the environment.

One consequence of replacing the fan and relocating it is that the air flow and forced convection cooling capacity are reduced. For this reason, additional modifications may be made to any significant heat-generating devices known to those skilled in the art, by fitting heat sinks to them. By way of example, the CPU can be fitted with a heat sink, such as the Penguin series made by Wakefield Engineering of Wakefield, Mass. The heat sink is brought into intimate thermal contact with the CPU by the use of a heat sink compound, such as manufactured by Envi-ro-tech of Amarillo Tex., and offered as product number 1675.

The reduction in cooling capacity occasioned by the modified fan and fan mounting location described above, also requires that the computer be modified so that less heat is generated internally. For this purpose, the standard power supply unit may be replaced with a convection-cooled, high efficiency power supply 32 (FIG. 1), such as manufactured by Skynet Electronic Co. Ltd. of Milpitas, Calif., and offered as Model SNP-9100. Such power supply is rated to operate to 50° Celsius.

Figure 11:
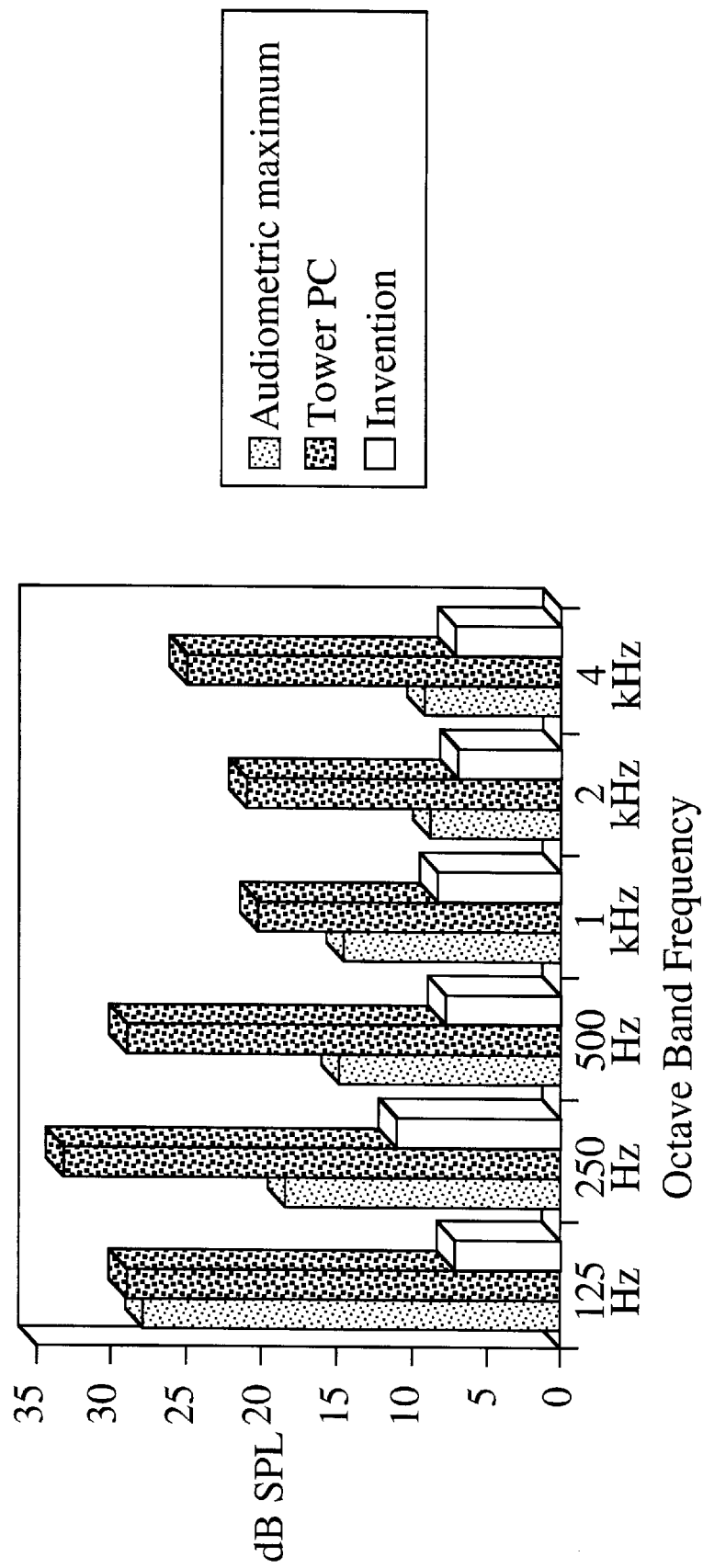
FIG. 11 is a graph that compares the sound level of a personal computer that incorporates the herein disclosed invention to that of an unmodified tower computer, both relative to maximum permissible ambient noise sound pressure levels for audiometric conditions.

FIG. 11 shows the noise level reduction achieved in a tower computer by the invention. At all audiometric frequencies between 125 Hz and 4 kHz, the sound emissions of a personal computer that incorporates the herein described invention are shown to be below the maximum permissible ambient noise sound pressure levels for audiometric conditions.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

We claim:

1. An apparatus for the mitigation of noise generated by and including a noise generating electrical or electro-mechanical assembly, comprising:

a sound barrier layer substantially surrounding said noise generating electrical or electro-mechanical assembly, said sound barrier layer further comprising a thermally conductive material; and a thermally conductive electrically insulating material in direct contact with heat generating components mounted within said noise generating electrical or electro-mechanical assembly;

wherein said thermally conductive electrically insulating material provides a continuous, thermally conductive path between said heat generating components to mediate thermal stress within said noise generating electrical or electro-mechanical assembly.

2. The apparatus of claim 1, wherein said thermally conductive electrically insulating material comprises a coating.

3. The apparatus of claim 2, wherein said coating comprises a low viscosity, high density, two part silicone.

4. The apparatus of claim 1, further comprising:

at least one contact made between said thermally conductive electrically insulating material and an electrical or electro-mechanical assembly frame containing said components to permit heat generated by said heat generating components within said noise generating electrical or electro-mechanical assembly to be conducted to said frame.

5. The apparatus of claim 1, further comprising:

at least one conductive pathway which conducts heat away from said noise generating electrical or electro-mechanical assembly to a system frame.

6. The apparatus of claim 1, wherein said noise generating electrical or electro-mechanical assembly is dimensioned such that intimate contact is made between said sound barrier layer and a system frame.

7. The apparatus of claim 1, further comprising:

female screw threads incorporated into said sound barrier layer to allow said noise generating electrical or electro-mechanical assembly to be mounted within a system, wherein efficient thermal transfer from said noise generating electrical or electro-mechanical assembly to a system frame occurs.

8. The apparatus of claim 1, said thermally conductive bracket further comprising:

at least one U-shaped bracket.

9. The apparatus of claim 1, wherein said noise generating electrical or electro-mechanical assembly is fully encapsulated by said sound barrier layer.

10. The apparatus of claim 1, wherein said noise generating electrical or electro-mechanical assembly is contained within a system, said system further comprising:

a low noise fan having a rated noise of about 20 dBA or less.

11. The apparatus of claim 1, wherein said noise generating electrical or electro-mechanical assembly is contained within a system, said system further comprising:

a fan positioned internally within said system, wherein said fan primarily recirculates air within a system enclosure.

12. The apparatus of claim 1, wherein said noise generating electrical or electro-mechanical assembly is contained within a system, said system further comprising:

a fanless, convection-cooled power supply.

13. An apparatus for the mitigation of noise generated within a system, comprising:

a noise generating electrical or electro-mechanical assembly;

a sound barrier layer encapsulating said electrical or electro-mechanical assembly, said sound barrier layer further comprising a thermally conductive electrically insulating material;

at least one thermally conductive bracket connecting said assembly to a system frame, wherein efficient thermal transfer from said electrical or electro-mechanical assembly to said system frame occurs: and at least one heat-conducting, vibration absorbing spacer positioned between said thermally conductive bracket and said system frame, wherein at least one spacer is secured to said electrical or electro-mechanical assembly frame:

wherein said at least one spacer protrudes through said sound barrier layer; and wherein said at least one spacer is secured to a system frame;

such that said at least one spacer effects heat transfer between said electrical or electro-mechanical assembly frame and said system frame.

14. The apparatus of claim 13, further comprising:

at least one conductive pathway which conducts heat away from said noise generating electrical or electro-mechanical assembly to a system frame.

15. The apparatus of claim 13, wherein said noise generating electrical or electro-mechanical assembly is dimensioned such that intimate contact is made between said sound barrier layer and a system frame.

16. The apparatus of claim 13, further comprising:

female screw threads incorporated into said sound barrier layer to allow said noise generating electrical or electro-mechanical assembly to be mounted within a system, wherein efficient thermal transfer from said noise generating electrical or electro-mechanical assembly to a frame occurs.

17. The apparatus of claim 13, said thermally conductive bracket further comprising:

at least one U-shaped bracket.

18. The apparatus of claim 13, wherein said noise generating electrical or electro-mechanical assembly is fully encapsulated by said sound barrier layer.

19. The apparatus of claim 13, further comprising:

a low noise fan within said system having a rated noise level of about 20 dBA or less.

20. The apparatus of claim 13, further comprising:

a fan positioned internally within said system, wherein said fan primarily recirculates air within a system enclosure.

21. The apparatus of claim 13, further comprising:

a convection-cooled power supply.

* * * * *